United States Patent [19]
Lakshmikumar et al.

[11] Patent Number: 5,767,736
[45] Date of Patent: Jun. 16, 1998

[54] CHARGE PUMP HAVING HIGH SWITCHING SPEED AND LOW SWITCHING NOISE

[75] Inventors: Kadaba R. Lakshmikumar, Wescosville, Pa.; Khong-Meng Tham, San Diego, Calif.

[73] Assignee: Lucent Technologies Inc., Murray Hill, N.J.

[21] Appl. No.: 863,930

[22] Filed: May 27, 1997

Related U.S. Application Data

[63] Continuation of Ser. No. 562,970, Nov. 27, 1995, abandoned.

[51] Int. Cl.$^6$ .................................................. G05F 1/10
[52] U.S. Cl. ........................................ 327/536; 327/157
[58] Field of Search ................................ 327/535, 536, 327/537, 546, 581, 589, 157, 148, 156; 323/315; 331/17

[56] References Cited

U.S. PATENT DOCUMENTS

| | | | |
|---|---|---|---|
| 4,677,323 | 6/1987 | Marsh | 307/571 |
| 4,847,519 | 7/1989 | Wahl et al. | 327/536 |
| 5,196,739 | 3/1993 | Sandhu et al. | 327/536 |
| 5,266,842 | 11/1993 | Park | 327/537 |
| 5,343,088 | 8/1994 | Jeon | 327/536 |
| 5,362,990 | 11/1994 | Alvarez et al. | 327/536 |
| 5,453,680 | 9/1995 | Giolma et al. | 327/536 |
| 5,459,653 | 10/1995 | Seto et al. | 363/73 |
| 5,473,283 | 12/1995 | Luich | 331/18 |
| 5,481,221 | 1/1996 | Gariboldi et al. | 327/536 |

OTHER PUBLICATIONS

Masayuki Mizuno et al., "A 0.18 μm CMOS Hot-Standby Phase-Locked Loop Using a Noise-Immune Adaptive-Gain Voltage-Controlled Oscillator," ISSCC95/Session 15/Frequency Synthesizers/Paper FA 15.6.

Iiya Novof et al., "Fully-Integrated CMOS Phase-Locked Loop with 15 to 240MHz Locking Range and ±50ps Jitter," ISSC95/Session 6/Digital Design Elements/Paper TA 6.5.

John F. Ewen et al., "Single-Chip 1062/Mbaud CMOS Transceiver for Serial Data Communication," ISSCC95/Session 2/Data Communications/Paper WP 2./1.

Trudy Stetzler et al., "A 2.7V to 4.5V Single-Chip GSM Transceiver RF Integrated Circuit," ISSCC95/Session 8/Wireless Communications/Paper TA 8.8.

Alex Waizman, "Delay Line Loop for Frequency Synthesis of De-Skewed Clock," ISSCC95/Session 18/High Performance Logic and Circuit Techniques/Paper 18.5.

A. Terukina et al., "A High Precision(+/-31 100ppm) CMOS Clock Generator for Optimum Sampling of Analog RGB Data," IEEE 1993 Custom Integrated Circuits Conference, pp. 27.3.1-27.3.5.

M. J. Bayer et al., "Cell Based Fully Integrated CMOS Frequency Synthesizers," IEEE 1993 Custom Integrated Circuits Conference, pp. 27.2.1-27.2.3.

Avner Efendovich et al., "Multi-Frequency Zero-Jitter Delay-Locked Loop," IEEE 1993 Custom Integrated Circuits Conference, pp. 27.1.1-27.1.4.

Michael Franz et al., "A 240MHz Phase-Locked-Loop Circuit Implemented as a Standard Macro on CMOS SOG Gate Arrays," IEEE 1992 Custom Integrated Circuits Conference, pp. 25.1.1-25.1.4.

Ricky F. Bitting et al., "A 30-128MHz Frequency Synthesizer Standard Cell," IEEE 1992 Custom Integrated Circuits Conference, pp. 24.1.1-24.1.6.

(List continued on next page.)

Primary Examiner—Timothy P. Callahan
Assistant Examiner—My-Trang Nu Ton

[57] ABSTRACT

Briefly, in accordance with one embodiment of the invention, a charge pump comprises: a plurality of transistors coupled in a transistor circuit configuration. The transistor circuit configuration is adapted to be coupled to an electronic circuit. The plurality of transistors are coupled so as to deliver electrical charge to the electronic circuit in response to applied signals as the difference of two substantially predetermined currents.

18 Claims, 5 Drawing Sheets

OTHER PUBLICATIONS

Edward Liu et al., "Behavorial Representations for VCO and Detectors in Phase–Lock Systems," IEEE 1992 Custom Integrated Circuits conference. pp. 12.3.1–12.3.4.

Ian A. Young et al., "A PLL CLock Generator with 5 to 110MHz of Lock Range for Microprocessors," IEEE Journal of Solid State Circuits, vol. 27, No. 11, Nov. 1992, pp. 1599–1607.

Beomsup Kim et al., "A 30–MHz Hybrid Analog/Digital Clock Recovery Circuit in 2 μm CMOS," IEEE Journal of Solid State Circuits, vol. 25, No. 6, Dec. 1990, pp. 1385–1394.

Mehmet Soyuer et al., "Frequency Limitations of a Conventional Phase–Frequency Detector," IEEE Journal of Solid State Circuits, vol. 25, No. 4, Aug. 1990, pp. 1019–1022.

Kurt M. Ware et al., "A 200–MHz CMOS Phase–Locked Loop with Dual Phase Detectors," IEEE Journal Of Solid State Circuits, vol. 24, No. 6 Dec. 1989, pp. 1560–1568.

Sam Yinshang et al., "An Analog PLL–Based Clock and Data Recovery Circuit with High Input Jitter Tolerance," IEEE Journal of Solid State Circuits, vol. 24, No. 2, Apr. 1989, pp. 325–330.

Mark G. Johnston et al., "A Variable Delay Line PLL for CPU–Coprocessor Synchronization," IEEE Journal of Solid—State Circuits, vol. 23, No. 5, Oct. 1988, pp. 1218–1223.

Deog–Kyoon Jeong et al., "Design of PLL–Based Clock Generation Circuits," IEEE Journal of Solid State Circuits, vol. SC–22, No. 2, Apr. 1987, pp. 255–261.

Milton E. Wilcox, "A 2–V Amplitude–Linear Phase–Locked Loop," IEEE Journal of Solid State Circuits, vol. SC–21, No. 6, Dec. 1986, pp. 934–939.

PRIOR ART

PRIOR ART

FIG. 7

CHARGE PUMP HAVING HIGH SWITCHING SPEED AND LOW SWITCHING NOISE

This is a Continuation of application Ser. No. 08/562,970 filed Nov. 27, 1995, now abandoned.

TECHNICAL FIELD

The present invention relates to charge pumps, such as may be employed in a phase-locked loop, for example.

BACKGROUND OF THE INVENTION

Conventional analog phase-locked loops (PLLs) typically comprise a phase detector, a charge pump, a loop filter, and a voltage- or current-controlled oscillator. Typically, a charge pump generates "packets" of positive or negative charge for the loop filter, based at least in part on the state of the phase detector. Typically, the amount of charge is varied by varying the duration of a relatively fixed current applied to the loop filter.

In a variety of applications, it is desirable to employ a charge pump capable of providing a relatively high switching speed. Typically, such high speed switching circuits require relatively large currents and frequently also generate switching noise. However, in a phase-locked loop, in order to reduce the jitter bandwidth, it is desirable to employ a relatively low charge pump current. A circuit that may be employed as a charge pump and that employs a relatively large switching current is described in U.S. Pat. No. 4,677,323, titled "Field Effect Transistor Current Switching Circuit," by Douglas Marsh, issued Jun. 30, 1987, assigned to the assignee of the present invention and herein incorporated by reference. A need, therefore, exists for a charge pump that exhibits relatively high switching speed while also addressing jitter bandwidth issues.

SUMMARY OF THE INVENTION

Briefly, in accordance with one embodiment of the invention, a charge pump comprises: a plurality of transistors coupled in a transistor circuit configuration. The transistor circuit configuration is adapted to be coupled to an electronic circuit. The plurality of transistors are coupled so as to deliver electrical charge to the electronic circuit in response to applied signals as the difference of two substantially predetermined currents.

Briefly, in accordance with another embodiment of the invention, an integrated circuit comprises: a charge pump circuit. The charge pump circuit includes a first transistor and a second transistor. The first transistor is coupled in the charge pump circuit so as to deliver a first substantially predetermined current bias, and the second transistor is coupled in the charge pump circuit so as to deliver, in response to an applied signal, a second substantially predetermined current bias other than the first substantially predetermined current bias.

Briefly, in accordance with yet another embodiment of the invention, a method of pumping electrical charge to a node in an electronic circuit comprises the steps of: applying a first current to the node via a first current path connected to the node, the first current path including a first transistor coupled in the first current path so as to affect the first current through the first current path, applying a second current to the node via a second current path connected to the node, the second current path including a second transistor coupled in the second current path so as to affect the second current through the second current path, and adjusting the charge applied to the node by adjusting the voltage applied at least to one of the first transistor and the second transistor.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof, may best be understood by reference to the following detailed description when read with the accompanying drawings in which:

DETAILED DESCRIPTION

Figure 6:
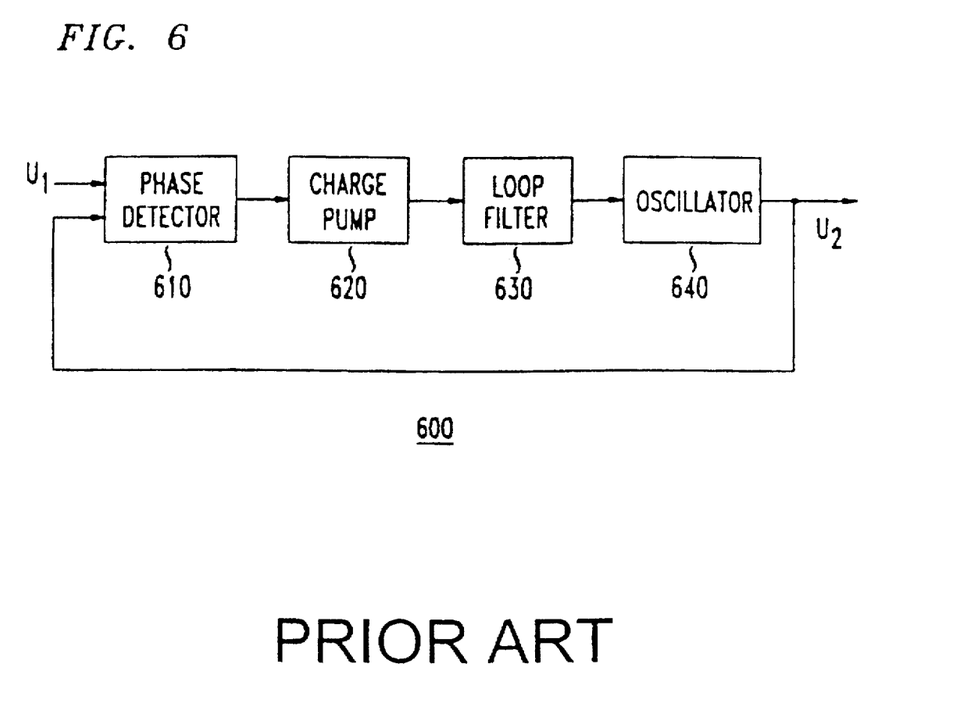
FIG. 6 is a block diagram illustrating a conventional phase-locked loop (PLL).

FIG. 6 is a block diagram illustrating a conventional phase-locked loop (PLL), including a phase detector 610, a charge pump 620, a loop filter 630, and an oscillator 640. Typically, oscillator 640 will comprise either a voltage-controlled oscillator or a current-controlled oscillator, depending upon the particular implementation. As is well-known, a charge pump circuit, such as charge pump 620 illustrated in FIG. 6, produces "packets" of positive and negative charge to be applied to the loop filter, based at least in part on the state of the phase detector, such as phase detector 610 in FIG. 6. Phase detector 610 typically compares the relative phase of two signals, such as signal $U_1$ and signal $U_2$ illustrated in FIG. 6. Typically, the amount of charge may be varied by varying the duration of a relatively fixed current that may be applied to the loop filter, such as loop filter 630. Varying the amount of charge adjusts the phase of signal $U_2$.

Figure 2:
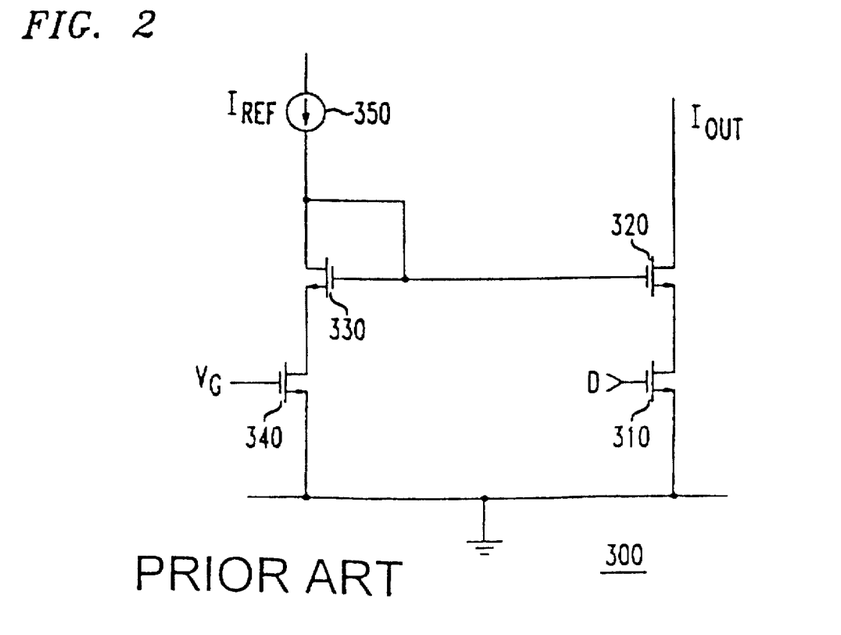
FIG. 2 is a circuit diagram illustrating a charge pump circuit implementation.

In such PLLs, it is desirable that the charge pump circuit attain a relatively high-switching speed. However, in high speed switching circuits, a relatively large current is typically required to produce a relatively quick response and also this large current frequently generates a substantial amount of switching noise. A charge pump circuit implementation 300 is illustrated in FIG. 2, for example. This particular charge pump circuit is related to the circuit illustrated in aforementioned U.S. Pat. No. 4,677,323. As illustrated in FIG. 2, charge pump circuit 300 includes four metal-oxide-semiconductor (MOS) transistors, 310, 320, 330 and 340. As illustrated, a reference current, $I_{REF}$, is applied to transistor 330. Transistor 330 is coupled in a circuit configuration so that its current may be mirrored to transistor 320. Likewise, gate-to-source voltage, $V_{G'}$ is applied to transistor 340 so that transistor 330 has a substantially conductive electrical path coupling its source to electrical ground. In this particular implementation of a charge pump circuit, depending upon the signal provided by a phase detector, such as phase detector 610 illustrated in FIG. 6, for example, the voltage applied to transistor 310 may have substantially the same magnitude as the voltage applied to transistor 340 or, alternatively, electrical ground may be applied. Furthermore, transistors 340 and 310 are substantially matched. Thus, when a voltage level corresponding to the level of voltage $V_G$ is applied to transistor 310, transistor 310 couples the source of transistor 320 to ground and, due to the mirroring effect of the transistors, as previously described, a current $I_{OUT}$ is provided that substantially matches current $I_{REF}$. Current $I_{OUT}$ may be provided to a loop filter, such as loop filter 630 illustrated in FIG. 6, for example. Alternatively, when the gate of transistor 310 is grounded, the source of transistor 320 does not have a substantially conductive path to ground and, therefore, substantially no current is provided via transistor 320 to a loop filter coupled to the charge pump circuit.

Figure 1:
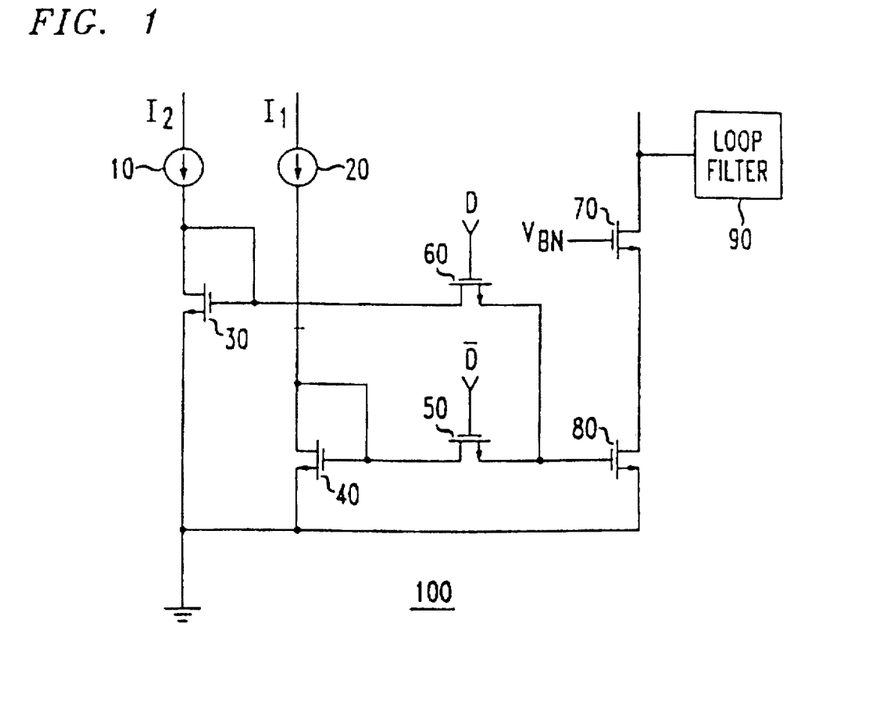
FIG. 1 is a circuit diagram illustrating a portion of an embodiment of a charge pump in accordance with the invention.

FIG. 1 is a circuit diagram illustrating a portion of an embodiment of a charge pump in accordance with the invention. As illustrated by embodiment 100 and described in more detail hereinafter, a current differencing technique is employed. More specifically, in this particular embodiment, the gate-to-source voltage applied to transistor 80 may be switched so as to deliver a current level $I_1$ or a current level $I_2$. Thus, a difference in current, $I_2-I_1$, may be applied to loop filter 90 by switching between these current levels. As illustrated in FIG. 1, transistor 70 comprises a cascode device employed to reduce switching noise "feed through" and to provide a relatively high output impedance. Likewise, in embodiment 100, both transistors 70 and 80, which in this embodiment each comprise MOS transistors, are biased so as to operate in the saturation region. The change in the gate-to-source voltage of transistor 80 in order to switch between the two current levels, $I_1$ and $I_2$, as previously described, is given by the following equation.

$$\Delta V_{GS} = \frac{(\sqrt{I_2} - \sqrt{I_1})}{\sqrt{K'W/L}} \quad (1)$$

where $\Delta V_{GS}$ is the change in the gate-to-source voltage, W is the transistor width, L is the transistor length, and K' is the product of channel mobility and gate oxide capacitance per unit area.

Based upon equation (1) above, an embodiment of a charge pump in accordance with the present invention should provide relatively higher switching speed in comparison with the charge pump circuit illustrated in FIG. 2, for example. For example, the voltage change applied to the transistor being switched, such as transistor 80, is a smaller voltage change than the voltage change employed to turn transistor 310 in FIG. 2 from a conducting state to a substantially non-conducting state. Thus, this change in voltage for transistor 80 may be accomplished in a relatively shorter period of time. Furthermore, since the gate of transistor 70 is coupled to a relatively fixed voltage bias, designated $V_{BN}$ in FIG. 1, the source node of transistor 70, due to capacitance typically associated with the source of transistor 70 and the drain of transistor 80, should change by a smaller voltage in comparison with the node coupling the source of transistor 320 and the drain of transistor 310, for example, and, thus, the time that it takes this node to charge to that smaller voltage should be shorter in comparison with the aforementioned node of charge pump circuit 300.

As illustrated by embodiment 100 shown in FIG. 1, transistor 80 switches currents based at least in part upon the mirroring achieved by the transistor circuit configuration. As illustrated in FIG. 1, two reference or bias currents, designated 10 and 20, are provided to the transistor circuit configuration. As illustrated, transistors 30 and 40 are coupled to transistor 80 in a current-mirror configuration controlled, at least in part, by transistors 60 and 50, respectfully. Thus, depending upon voltage signals applied to the gates of transistors 50 and 60, transistor 80 will either deliver current $I_1$ or current $I_2$. Likewise, the signals applied to transistors 60 and 50 may be provided by a phase detector. For example, in this particular embodiment, signals D and $\overline{D}$ are illustrated, where a D signal applied to transistor 60 designates a decrease in the loop filter output voltage assuming that $I_2>I_1$. Of course, $\overline{D}$ designates the complement of D.

Aside from the advantage of a relatively higher switching speed in comparison with the circuit shown in FIG. 2 and described in aforementioned U.S. Pat. No. 4,677,323, an embodiment of a charge pump in accordance with the invention may provide other advantages as well. For example, an embodiment of a charge pump in accordance with the invention, such as embodiment 100 illustrated FIG. 1, typically exhibits higher output impedance than, for example, the circuit illustrated in FIG. 2. One reason for this is because, whereas transistor 310 in FIG. 2 typically operates in its triode region, in comparison transistor 80 may be operated in its saturation region, as previously indicated. Thus, an embodiment of a charge pump in accordance with the invention more closely resembles an ideal current source due to the higher output resistance.

In addition to the foregoing advantages, another advantage of an embodiment of a charge pump in accordance with the invention is lower switching noise. Typically, the amount of switching noise is proportional to the change in the voltage amplitude applied to the switching transistor, such as transistor 80 in FIG. 1. This proportional relationship is due at least in part to the capacitance between the gate of transistor 80 and the source of transistor 70. Thus, because an embodiment of a charge pump in accordance with the invention typically applies a smaller change in the gate-to-source voltage, as previously described, likewise, the switching noise should also be reduced.

Yet another advantage of an embodiment of a charge pump in accordance with the invention is the ability to produce a lower output current in comparison with conventional approaches. One reason why lower output current may be produced and still achieve satisfactory operation is due to the current differencing technique used to obtain relatively high speed switching. Typically, to achieve high speed switching requires relatively large current levels, both to achieve the large voltage change in a relatively short period of time and, likewise, to reduce the relative effect of the switching noise on the signal produced by the charge pump circuit. However, producing low output current levels provides several advantages. First, as will be described in more detail later, low output current provides an advantage in connection with the resulting jitter bandwidth, such as where the charge pump is employed in a phase-locked loop. Second, in a charge pump, typically matching the up and down currents while achieving relatively high switching speed is a challenge because it is more difficult to substantially match the currents in devices in which a short channel length is employed. However, a short channel length is typically employed because it results in a transistor that switches quickly. For an embodiment of a charge pump in accordance with the present invention, a relatively high switching speed may be achieved without these relatively short channel lengths. Therefore, better matching of up and down currents may be achieved without a substantial loss in switching speed.

As previously indicated, one advantage of an embodiment of a charge pump in accordance with the invention includes the ability to obtain satisfactory operation with a relatively low output current. This advantage may be particularly useful in connection with an embodiment of a charge pump in accordance with the invention incorporated in a phase-locked loop, although, of course, the invention is not limited in scope in this respect. An embodiment of a charge pump in accordance with the invention may, for example, alternatively be incorporated in a delay-locked loop or an automatic gain control circuit. However, as is well-known, the jitter bandwidth of a second-order phase-locked loop is directly proportional to the phase detector gain in accordance with the following equation.

$$W_{-3db} = K_o K_d R \quad (2)$$

where $K_o$ is the gain of the voltage-controlled oscillator, $K_d$ is the phase detector gain, and R is the value of the resistance in the loop filter. Furthermore, the overwhelming majority of phase-locked loops are second-order. Likewise, as is well-known, the phase detector gain varies directly with the magnitude of the current pulse produced by the charge pump. Thus, reducing the magnitude of the output current of the charge pump reduces the jitter bandwidth, which is a desirable feature in many phase-locked loop applications.

In addition to the previous advantage associated with reducing the magnitude of the charge pump current, for a given jitter bandwidth, reducing the magnitude of the current pulse produced by the charge pump also has an impact on the damping factor associated with the loop filter of the phase-locked loop. In general, the damping factor, $\zeta$, is proportional to the square root of the current divided by the loop filter capacitance in accordance with the following relationship.

$$\zeta \alpha \sqrt{\frac{I}{C}} \quad (3)$$

where I is the magnitude of the current and C is the loop filter capacitance. Thus, reducing the magnitude of the current pulse allows the loop filter capacitance to be reduced while maintaining substantially the same damping factor, if desired. This provides an advantage for an embodiment of a charge pump in accordance with the invention employed in a phase-locked loop, because typically the loop filter capacitor is relatively large and, thus, either cannot be integrated with the phase-locked loop circuitry or, alternatively, the capacitor occupies a significant portion of the chip area of the integrated circuit. Another advantage, therefore, of an embodiment of a charge pump in accordance with the invention is that it provides the capability to fully integrate the phase-locked loop or to reduce the associated chip area by reducing the capacitance needed without a substantial reduction in the loop filter damping factor.

Figure 3:
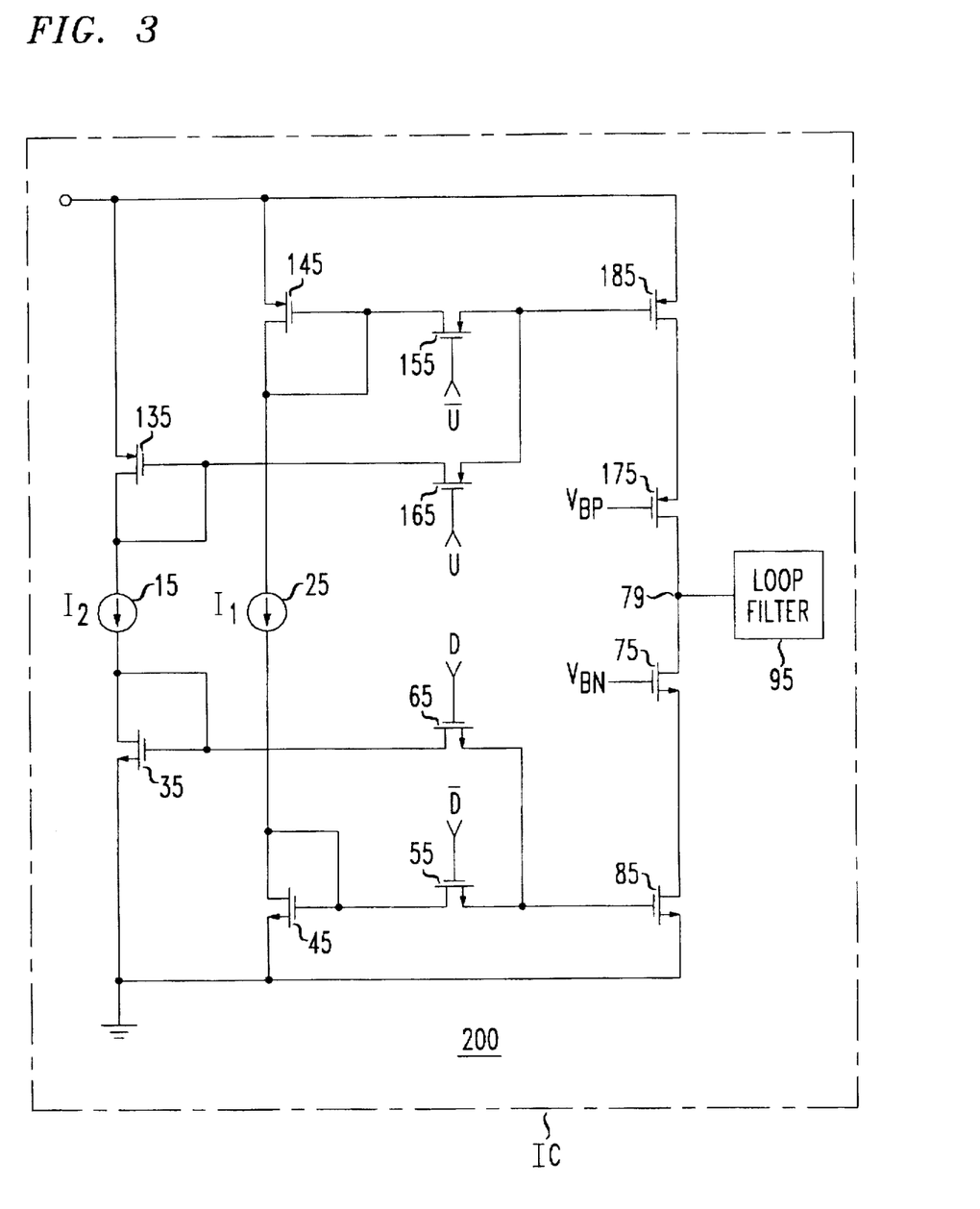
FIG. 3 is a circuit diagram illustrating an embodiment of a charge pump in accordance with the invention incorporating the portion of the embodiment illustrated in FIG. 1.

FIG. 3 is a circuit diagram illustrating an embodiment 200 of a charge pump in accordance with the invention that includes the portion of the embodiment illustrated in FIG. 1. This embodiment is illustrated as incorporated on an integrated circuit (IC), although, of course, the invention is not limited in scope in this respect. This embodiment illustrates a charge pump circuit that has the capability to both source and sink current. However, because in CMOS technology typically P-channel MOS transistors exhibit lower speed than N-channel MOS transistors, the switching speed of this particular embodiment may be limited by the switching speed of the P-channel MOS transistors. Nonetheless, this particular embodiment operates in accordance with the current differencing technique previously described. Thus, reference current sources 15 and 25 provide current biases $I_2$ and $I_1$, respectively. During operation where, for example, embodiment 200 is incorporated in a phase-locked loop in equilibrium, a ground voltage level may be applied to the gates of transistors 65 and 165 and, therefore, current $I_1$ is mirrored to transistor 185 and to transistor 85 via transistors 145 and 45, respectfully. However, as previously described, where the output voltage of the loop filter is to be reduced, a down signal, designated D in FIG. 3, may be applied to transistor 65. As a result, in the manner previously described, current $I_2$ is mirrored to transistor 85 via transistor 35. Thus, the difference between currents $I_1$ and $I_2$ may be applied to filter 95 in a manner so as to reduce the loop filter output voltage by discharging the loop filter capacitance. In this example, of course, it is assumed that current $I_2$ exceeds current $I_1$, although the invention is not limited in scope in this respect. Alternatively, where the output voltage of the loop filter is to be increased, an up signal, designated U in FIG. 3, may be provided to transistor 165 so that current $I_2$ may be mirrored to transistor 185 via transistor 135 and, again, the difference between currents $I_1$ and $I_2$ may be applied to loop filter 95. However, whereas previously the output voltage of loop filter 95 was reduced by mirroring current $I_2$ to transistor 85, now the output voltage of loop filter 95 is increased by mirroring current $I_2$ to transistor 185 because, for this example of the operation of this particular embodiment, current $I_2$ flows in an opposite direction from the previous example of charge pump operation.

Figure 4:
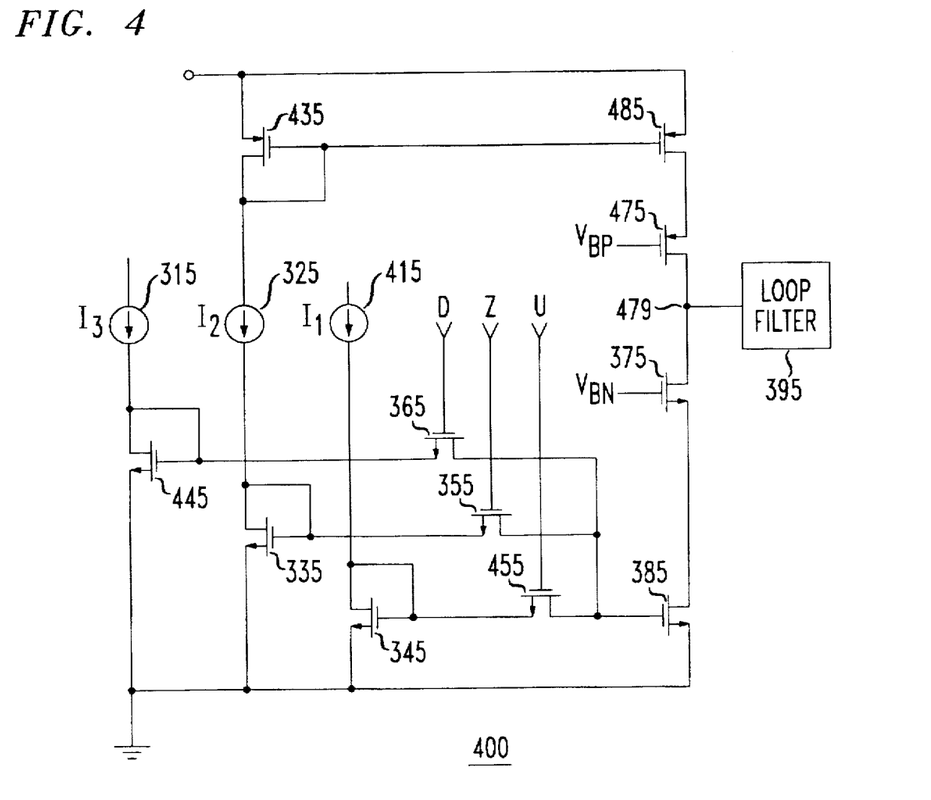
FIG. 4 is a circuit diagram illustrating yet another embodiment of a charge pump in accordance with the invention.

FIG. 4 illustrates yet another embodiment 400 of a charge pump in accordance with the invention. In this particular embodiment, only N-channel MOS transistors are switched, such as 335, 445, 345, and 385, to improve switching speed. The P-channel devices are coupled in a manner to provide a relatively constant current. Thus, in this particular embodiment, current $I_2$ is mirrored via transistors 435 and 485 to loop filter 395. Thus, during operation, when an equilibrium situation is encountered, such as previously described, a signal is provided to transistor 355 so that current $I_2$ may, likewise, be mirrored to transistor 385. In this particular embodiment, it is assumed that current $I_2$ exceeds current $I_1$ and that current $I_3$ exceeds current $I_2$, although the invention is not limited in scope in this respect. Thus, in a PLL, when it is desired to reduce the output voltage of the loop filter, such as 395, a down signal, D, is applied to transistor 365 so that current $I_3$ may be mirrored to transistor 385 via transistor 445. Likewise, when it is desired to increase the output voltage of the loop filter, an up signal, U, may be applied to transistor 455 so that current $I_1$ may be mirrored to transistor 385 via transistor 345. Typically, an encoder may be employed so that signals provided by a phase detector may be encoded into signals D, Z, and U illustrated in FIG. 4, although the invention is, of course, not limited in scope in this respect.

Figure 5:
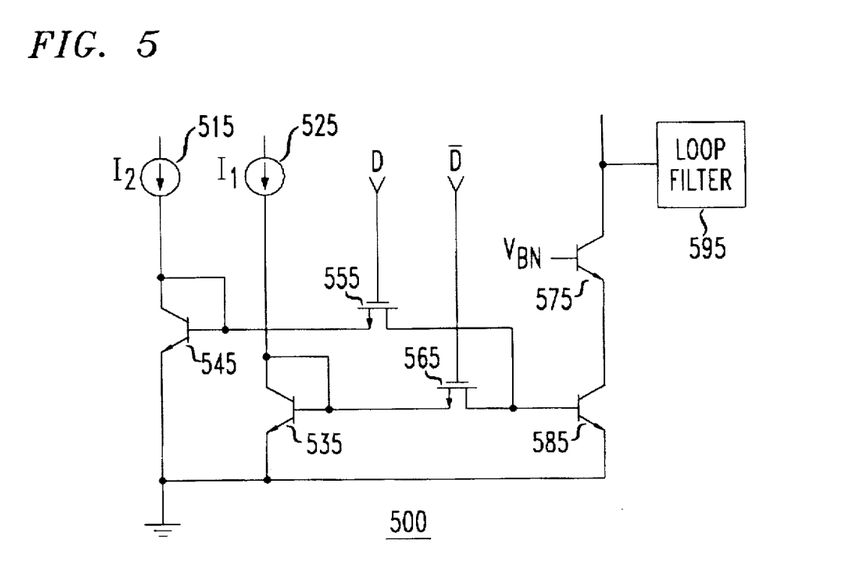
FIG. 5 is a circuit diagram illustrating still another embodiment of a charge pump in accordance with the invention.

FIG. 5 is a circuit diagram illustrating yet another embodiment 500 of a charge pump in accordance with the invention. In this particular embodiment, the circuit is implemented in BiCMOS technology. This particular embodiment should exhibit an improved switching speed in comparison with the embodiment illustrated in FIG. 1, for example. One reason for this improvement in switching speed is because the voltage change to switch from current level $I_1$ to current level $I_2$ should be relatively smaller because of the use of bipolar transistors, such as transistor 585, instead of MOS transistors. As is well-known, an exponential relationship exists between the voltage and current of a bipolar transistor in comparison with the square-law relationship exhibited by an MOS transistor. This exponential relationship may be expressed by the following equation.

$$I = I_S (e^{\frac{qV_{BE}}{KT}} - 1) \quad (4)$$

where $I_s$ is the reverse saturation current, $V_{BE}$ is the base-to-emitter voltage, T is absolute temperature, q is the electronic charge, and K is Boltzmann's constant. Thus, for a given change in current, a smaller change in voltage may be applied to a bipolar transistor to accomplish that change in current in comparison with an MOS transistor.

Figure 7:
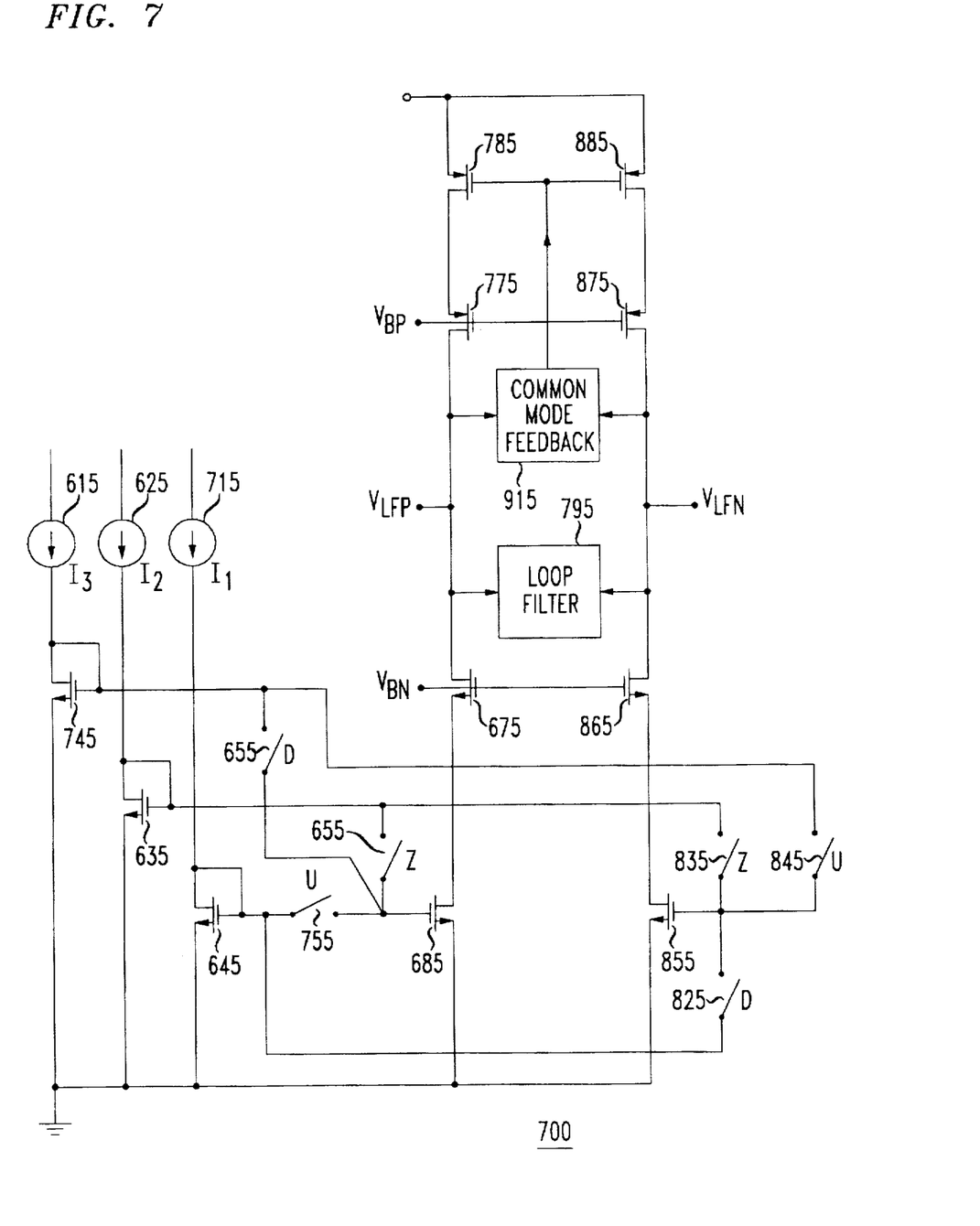
FIG. 7 is a circuit diagram illustrating one more embodiment of a charge pump in accordance with the invention.

FIG. 7 is a circuit diagram illustrating still another embodiment 700 of a charge pump in accordance with the invention. This particular embodiment illustrates that the charge pump in accordance with the invention may be employed to implement a fully differential circuit. For example, the embodiment illustrated in FIG. 7 is similar to the embodiment of FIG. 4. As illustrated in FIG. 7, embodiment 700 produces two output signals, $V_{LFP}$ and $V_{LFN}$. As illustrated, loop filter 795 is coupled to receive these two output signals. Likewise, a common mode feedback circuit coupled to receive the two output signals ensures that the common mode output voltage of the charge pump is approximately midway between the voltage of the positive supply and ground, in this particular embodiment. Otherwise, the embodiment illustrated in FIG. 700 operates in a fashion similar to that described with respect to the embodiment of FIG. 4.

An embodiment of a charge pump in accordance with the invention, such as the embodiments illustrated in FIGS. 3 and 4, for example, may be operated in accordance with the following method. A first current may be applied to a node, such as node 79 in FIG. 3, for example, by a first current path connected to the node. The first current path may include a first transistor, such as transistor 85 in FIG. 3, coupled in the first current path so as to affect the first current through the first current path. Likewise, a second current may be applied to the node, such as node 79 in FIG. 3, by a second current path connected to the node. The second current path may include a second transistor, such as transistor 185 in FIG. 3, coupled in the second current path so as to affect the second current through the second current path. Likewise, the charge applied to the node, such as node 79 in FIG. 3, may be adjusted by adjusting the gate-to-source voltage applied to at least one of the transistors, such as transistor 185 and transistor 85 in FIG. 3. Thus, as previously described, the voltage applied to transistors 85 or 185 may be adjusted to affect the charge applied to node 79. A similar approach may be applied for the embodiment illustrated in FIG. 4, as another example. Thus, the charge applied to node 479 may be adjusted by adjusting the voltage applied to transistor 385 in FIG. 4. The steps of applying the first current and second current to the node typically occur substantially simultaneously, although the invention is not limited in scope in this respect. Likewise, the step of adjusting the charge applied to the node by adjusting the voltage applied to at least one of the first transistor and the second transistor, such as transistors 85 and 185 in FIG. 3, for example, comprises adjusting the voltage applied so that at least one of the first current and the second current is switched between at least two substantially predetermined current bias levels, such as current levels $I_2$ and $I_1$, as previously described. Likewise, although a method of pumping electrical charge to a node in an electronic circuit is not limited in this respect, the node may comprise a node coupled to a loop filter circuit for a phase-locked loop, such as illustrated in FIGS. 3 and 4, for example.

While only certain features of the invention have been illustrated and described herein, many modifications, substitutions, changes or equivalents will now occur to those skilled in the art. It is, therefore, to be understood that the appended claims are intended to cover all such modifications and changes as fall within the true spirit of the invention.

The invention claimed is:

1. In an integrated circuit, a charge pump circuit comprising:

a first current mirror circuit; and a second current mirror circuit coupled to the first current mirror circuit at an output terminal, wherein the first and second current mirror circuits generate a first current and a second current, respectively, the first and second current mirror circuits together outputting an electrical charge to an electronic circuit at the output terminal in response to applied signals, the electrical charge corresponding to the difference between the first current and the second current;

wherein the first and second current mirror circuits are coupled to a plurality of current sources.

2. The charge pump of claim 1, wherein the electronic circuit comprises a loop filter circuit for a phase-locked loop.

3. The charge pump of claim 2, wherein the applied signals comprise signals generatable by a phase detector circuit for a phase-locked loop.

4. The charge pump of claim 1, wherein the first and second current mirrors comprise a plurality of MOS transistors.

5. The charge pump of claim 4, wherein the applied signals comprise voltage signals applied to the gates of selected transistors in the plurality of MOS transistors, the selected transistors comprising only N-channel MOS transistors.

6. The charge pump of claim 4, wherein the first and second current mirrors further comprise bipolar transistors.

7. The charge pump of claim 1, wherein the charge pump is coupled in a fully differential circuit configuration.

8. An integrated circuit including a charge pump circuit, said charge pump circuit comprising:

a first current mirror circuit that generates a first current, the first current mirror circuit coupled to a plurality of current sources;

a second current mirror circuit that generates a second circuit, the second current mirror circuit coupled to the plurality of current sources;

a first transistor coupled to an output of the first current mirror circuit; and a second transistor coupled to an output of the second current mirror circuit, wherein the first and second transistors are coupled in the charge pump circuit so that the charge pump circuit outputs a difference between the first and second currents.

9. The integrated circuit of claim 8, wherein the integrated circuit further comprises a loop filter circuit coupled to the output of the charge pump circuit.

10. The integrated circuit of claim 9, wherein an applied signal comprises a signal generatable by a phase detector circuit for phase-locked loop.

11. The integrated circuit of claim 8, wherein at least one of the first and second transistors include at least one of a bipolar transistor and a metal-oxide-semiconductor (MOS) transistor.

12. The integrated circuit of claim 8, wherein the charge pump circuit comprises a fully differential charge pump circuit.

13. The integrated circuit of claim 8, wherein the first and second transistors comprise MOS transistors.

14. The integrated circuit of claim 13, wherein the second transistor comprises an N-channel MOS transistor.

15. A method of pumping electrical charge to a node in an electronic circuit, comprising:

applying a first current to the node via a first current mirror circuit, wherein a first transistor is coupled to an output of the first current mirror circuit to apply the first current to the node and the first current mirror circuit is coupled to a plurality of current sources;

applying a second current to said node via a second current mirror circuit wherein a second transistor is coupled to an output of the second current mirror circuit to apply the second current to the node and the second current mirror circuit is coupled to the plurality of current sources; and adjusting the charge applied to the node by adjusting a voltage applied to at least one of the first and second transistors.

16. The method of claim 15, wherein applying the first current to the node and applying the second current to the node occur substantially simultaneously.

17. The method of claim 16, wherein adjusting the charge applied by adjusting the voltage applied to at least one of the first transistor and the second transistor comprises adjusting the voltage applied so that at least one of the first current and the second current switches between at least two current bias levels.

18. The method of claim 15, wherein the node comprises a node coupled to a loop filter circuit for a phase-locked loop.

* * * * *